(12) United States Patent
Lucas et al.

(10) Patent No.: US 6,989,229 B2
(45) Date of Patent: Jan. 24, 2006

(54) NON-RESOLVING MASK TILING METHOD FOR FLARE REDUCTION

(75) Inventors: Kevin D. Lucas, Austin, TX (US); Jonathan L. Cobb, Austin, TX (US); William L. Wilkinson, Georgetown, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 246 days.

(21) Appl. No.: 10/400,347

(22) Filed: Mar. 27, 2003

(65) Prior Publication Data

US 2004/0188383 A1    Sep. 30, 2004

(51) Int. Cl.
*G03F 7/20* (2006.01)

(52) U.S. Cl. ..................... 430/311; 430/396
(58) Field of Classification Search ............ 430/5, 430/311, 396; 378/34, 35; 716/19–21
See application file for complete search history.

(56) References Cited

U.S. PATENT DOCUMENTS

| 5,242,770 | A |   | 9/1993  | Chen et al.       |        |
|-----------|---|---|---------|-------------------|--------|
| 5,446,521 | A |   | 8/1995  | Hainsey et al.    |        |
| 5,636,002 | A | * | 6/1997  | Garofalo          | 355/53 |
| 5,652,465 | A |   | 7/1997  | Hosoda et al.     |        |
| 5,948,573 | A |   | 9/1999  | Takahashi         |        |
| 5,970,238 | A |   | 10/1999 | Shibata et al.    |        |
| 6,232,161 | B1|   | 5/2001  | Chen et al.       |        |
| 6,281,049 | B1|   | 8/2001  | Lee               |        |
| 6,410,193 | B1| * | 6/2002  | Stivers et al.    | 430/5  |
| 6,448,630 | B1|   | 9/2002  | Komori            |        |
| 6,486,006 | B2|   | 11/2002 | Hirano et al.     |        |
| 6,625,802 | B2| * | 9/2003  | Singh et al.      | 716/21 |
| 2004/0111693 | A1 | * | 6/2004 | Lin et al.      | 716/19 |

FOREIGN PATENT DOCUMENTS

| EP | 0 933 811 A2   | 8/1999 |
| EP | 0 933 811 A3   | 8/1999 |
| JP | 09107028       | 4/1997 |
| JP | 2000124305     | 4/2000 |
| WO | WO 96/15552 A1 | 5/1996 |
| WO | WO 01/01469 A2 | 1/2001 |

OTHER PUBLICATIONS

Reiger et al., "Using Behavior Modelling for Proximity Correction," *Optical/Laser Microlithography VII, SPIE—International Society for Optical Engineering Proceedings*, Timothy A. Brunner—Chair/Editor, Mar. 2-4, 1994, San Jose, California, vol. 2197, pp. 371-376.

(Continued)

*Primary Examiner*—Kathleen Duda
(74) *Attorney, Agent, or Firm*—Robert L. King; James L. Clingan, Jr.

(57) ABSTRACT

Photoresist on a wafer is exposed using tiles on a mask that improve flare performance. Features that are not to be exposed on the photoresist correspond to features on the mask. The various features are surrounded by other features that vary and thus affect flare differently. Selected features have tiles added nearby but also far enough away to improve uniformity in the effects of flare on the various features that are intended to be present in the photoresist. The tiles are made either very small in width or partially absorbing so that the tiles are not resolved in the photoresist. Thus the tiles reduce flare but do not alter the desired pattern in the photoresist.

26 Claims, 2 Drawing Sheets

OTHER PUBLICATIONS

Krautschik et al., "Impact of EUV Light Scatter on CD Control as a Result of Mask Density Changes," *SPIE,* vol. 4688-34, 2002, pp. 1-13.

Travis et al., U.S. Appl. No. 09/873,810 entitled "Method of Forming an Integrated Circuit Device Using Dummy Features and Structure Thereof," filed Jun. 4, 2001.

* cited by examiner

US 6,989,229 B2

NON-RESOLVING MASK TILING METHOD FOR FLARE REDUCTION

CROSS REFERENCE TO RELATED APPLICATION

This application is related to:

U.S. patent application Ser. No. 09/873,810, entitled "Method of Forming An Integrated Circuit Device Using Dummy Features and Structure Thereof," filed Jun. 4, 2001, and assigned to the assignee hereof.

FIELD OF THE INVENTION

This invention relates generally to semiconductor circuits, and more specifically, to the manufacture of semiconductors.

BACKGROUND OF THE INVENTION

Integrated circuit manufacturing uses photolithography to transfer patterns from a master mask to a semiconductor substrate. As feature dimensions used in integrated circuits have become sub-micron various problems are encountered. The small dimensions approach the physical capability of photolithography. At such dimensions, the nonplanarity of surfaces, such as wafers have a significant affect on feature resolution on the wafer. A known compensation technique is the use of tiles which are additional features formed on the semiconductor substrate in areas that are not used for functional circuitry. Tiling is used to improve the planarity or flatness of the substrate surface after a conventional chemical/mechanical polish (CMP) step. Tiling can also be used to equalize the chemical concentration during an etch step and ensure that the concentration is uniform across a wafer. A major limitation with tiling is that tiling cannot be used in close proximity to functional circuitry because of negative effects on device characteristics.

Another known compensation technique to compensate light diffraction at submicron dimensions is referred to generally as sub-resolution features or scattering bars. This technique involves the placement of small features on the mask in close proximity to the small isolated desired design features. The scattering bars are placed within less than three times the minimum feature spacing. Scattering bars make isolated features pattern as if they are dense features in that they decrease the sensitivity to focus variations in a photolithographic system. Another known lithography problem is referred to as flare which is the existence of scattered background light in a lithographic system. Flare is dependent upon the pattern density of a mask. As flare varies, there is also variation in wafer feature dimensions. Scattering bars may offer some improvement in highly local flare reduction and pattern uniformity. However the scattering bars do not provide improvement for medium or long range pattern density or flare distortion.

Another known lithographic issue is the variation of mask or reticle feature dimensions as mask pattern density varies. Tiling offers some improvement to this issue but tiling is limited in use due to the electrical modifications on functional devices as mentioned above. Subresolution scattering bars do not offer significant improvement to this problem. For both flare and reticle feature dimensions, there are solutions known as biasing feature edges. These solutions are generally referred to as optical proximity correction (OPC). A problem with these solutions is that they require extremely intense computation for every feature edge as to what is the impact of flare or reticle pattern density.

BRIEF DESCRIPTION OF THE DRAWINGS

The present invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
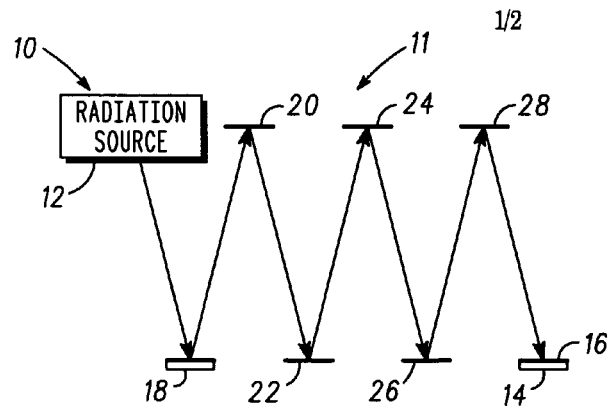
FIG. 1 illustrates in perspective form a semiconductor lithography system with a reflective mask, such as an extreme ultraviolet (EUV) system.

FIG. 1 illustrates an EUV lithography system or optical system 10 with an optical portion 11. Optical system 10 has a radiation source 12, a reflecting reticle or reflecting mask 18, and optical reflecting elements 20, 22, 24, 26 and 28. In one form, the optical reflecting elements 20, 22, 24, 26 and 28 are implemented with multiple layer mirrors. The radiation source 12 may be implemented in various forms such as a laser, a laser produced plasma, a gas discharge source or an electron beam source. In the illustrated form, light produced by the radiation source 12 is transferred from the radiation source 12 to the reflecting mask 18. A predetermined pattern exists on the reflecting mask 18. Portions of the predetermined pattern cause the radiation or light to reflect via the reflective mask by reflecting from reflecting mask 18 to an optical reflecting element 20. In sequential fashion the light is further reflected to optical reflecting elements 22, 24, 26 and 28. From optical reflecting element 28 the light is reflected to a photoresist layer in the form of photoresist 16 on a surface of a wafer 14 for the formation of a semiconductor device. Where light contacts photoresist 16, the photoresist 16 is rendered soluble by subsequent processing steps involving heating.

Unfortunately the optical system 10 is subject to non-specular reflection caused by roughness of the surfaces of reflecting mask 18 and each of the optical reflecting elements 20, 22, 24, 26 and 28. Roughness in the reflecting mask translate into focal errors at the wafer 14. Roughness in the optical reflecting elements 20, 22, 24, 26 and 28 translate into flare on wafer 14 that distorts the pattern intended to be transferred to wafer 14.

Figure 2:
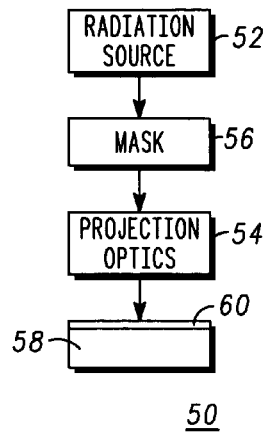
FIG. 2 illustrates in perspective form a semiconductor lithography system with a transmitting mask, such as a deep ultraviolet (DUV) system.

Illustrated in FIG. 2 is a DUV (deep ultraviolet) system or optical system 50 generally having a radiation source 52, a transmission mask or a transmitting mask 56, projection optics 54 and a semiconductor wafer 58 having overlying photoresist 60. Transmitting mask 56 is an optically transmissive mask and has both transmissive portions and absorbing portions. The radiation source 52 is implemented with either a laser or a gas discharge source. Light from radiation source 52 is transferred to the transmitting mask 56 that has a predetermined mask pattern thereon. The light transfers through the transmissive portions of the transmitting mask 56 and is directed via projection optics 54 onto the photoresist 60. Projection optics 54 may be implemented with a combination of refractive lenses and mirrors. The photoresist 60 is rendered soluble in those areas where light contacts the photoresist 60 by subsequent heating. There are numerous error sources in transferring the patterning from transmitting mask 56 to wafer 58 including roughness on the optical surfaces of the projection optics 54, inhomogeneities associated with the lens materials and undesired light reflections.

Figure 3:
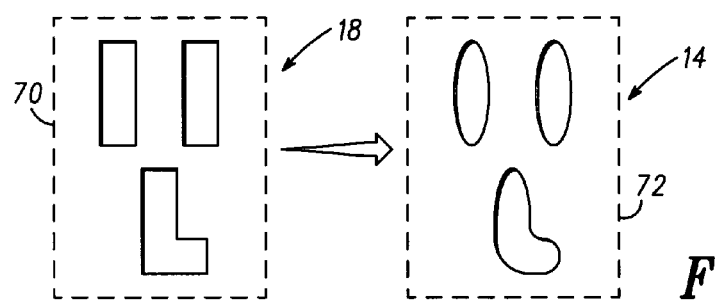
FIG. 3 illustrates a top view of a portion of a reflecting mask pattern transferred to a wafer with flare error.

Illustrated in FIG. 3 is a top view of a portion of a reflecting mask pattern transferred to a wafer with flare error. A flare proximity region 70 of a mask, such as reflecting mask 18 of FIG. 1, contains a pattern that is desired to be printed onto wafer 14. The flare proximity regions described herein may extend for several millimeters and include multiple sub-regions of varying pattern density. Flare effects are therefore imaging effects over both short and long ranges. It should be understood that transmitting mask 56 of FIG. 2 is analogous. Only a small portion of a complete pattern is illustrated for ease of explanation. It should be noted that the desired features have well defined edges such as a straight-edge and square corners. Due to the errors described above in connection with either optical system 10 or optical system 50, the resulting pattern on a wafer, such as wafer 14 of FIG. 1, is significantly distorted within a flare proximity region 72. The wafer features are smaller and are not well defined. Such feature distortions typically are unacceptable as the modified features change the electrical characteristics and functionality of the associated circuitry. It should be noted that for illustration purposes only that within each of flare proximity region 70 and flare proximity region 72 there is no other feature than the desired feature to be patterned.

Figure 4:
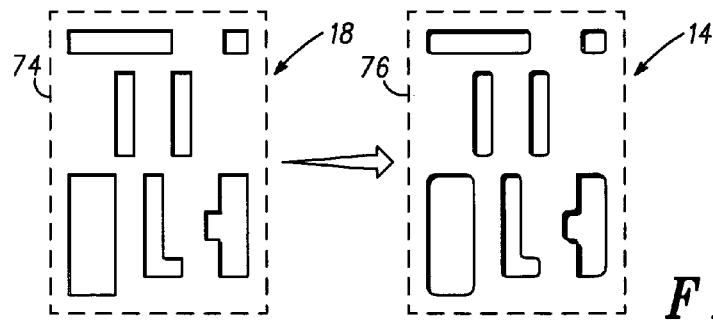
FIG. 4 illustrates a top view of a portion of a reflecting mask pattern transferred to a wafer with reduced but undesired flare error.

Illustrated in FIG. 4 is a top view of a portion of a reflecting mask pattern transferred to a wafer with reduced but undesired flare error. A section of mask 18 contains multiple features within a flare proximity region 74 and an analogous section of wafer 14 contains the same multiple features within a flare proximity region 76. Assume for explanation purposes that flare proximity region 74 is comparable to flare proximity region 70 and that flare proximity region 76 is comparable to flare proximity region 72. The flare error is reduced by the presence of other features within the flare proximity region 74. There are three features within the section of mask 18 that are analogous to that illustrated in FIG. 3. Additionally, there are four additional features within flare proximity region 74 that were not included within flare proximity region 70. Therefore, it should be noted that the increased pattern density significantly reduces the distortion from flare in the transferred pattern. What this phenomena means is that there can be large variation over a single integrated circuit pattern in flare based upon the pattern density.

Figure 5:
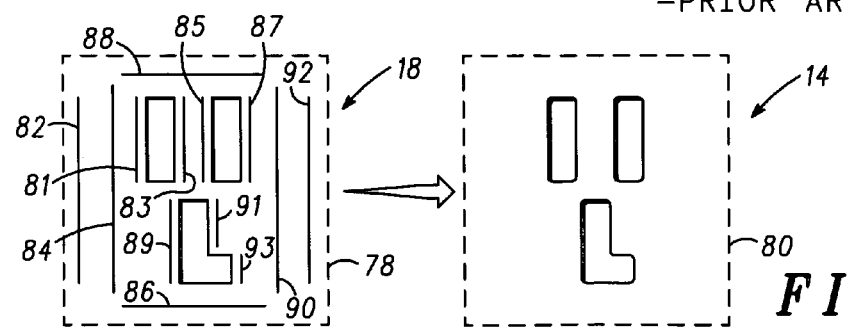
FIG. 5 illustrates a top view of a portion of a reflecting mask pattern transferred to a wafer with reduced flare error in accordance with one form of the present invention.

Illustrated in FIG. 5 is a top view of a portion of a reflecting mask pattern transferred to a wafer with reduced flare error. A flare proximity region 78 of mask 18 generally has a plurality of features desired to be transferred and one or more tiles having a length and a width such as tiles 82, 84, 86 88, 90 and 92. The length of the tiles is longer than a length of a correlated pattern feature by at least one hundred percent (100%). The tiles 82, 84, 86, 88, 90 and 92 do not get transferred onto the target wafer 14 having a flare proximity region 80. The reflecting mask has an absorbing portion made up of the feature patterns (not numbered) that reflect a portion of incident radiation while largely being absorbing. The tiles 82, 84, 86, 88, 90 and 92 reduce the pattern distortion from flare for a flare proximity region that does not have high pattern density. In order to keep each of tiles 82, 84, 86, 88, 90 and 92 from appearing on the target wafer 14, the width of each of tiles 82, 84, 86, 88, 90 and 92 is less than 0.3 multiplied by the magnification factor, and the wavelength of the radiation source, divided by the numerical aperture of the optical system 10 or 54. The magnification factor is the size of the features on the mask 18 divided by the size of the features on the wafer 14. The numerical aperture of the optical system 10 or 54 is the sine of the angle subtended by the exit pupil of the optical system at the plane of wafer 14. In addition to the width of each of tiles 82, 84, 86, 88, 90 and 92 being important, the placement of these tiles is also important. The features within flare proximity region 78 that are to be transferred onto wafer 14 must be separated from each other by a predetermined minimum spacing. Tiles 82, 84, 86, 88, 90 and 92 should therefore be positioned relative to the transferred features at a minimum distance from the transferred features that is approximately four times or greater than the minimum spacing. While not all tiles necessarily have a minimum distance of four times or greater the minimum spacing, the majority of the tiles do, if not all. Tiles 82, 84, 86, 88, 90 and 92 are fully radiation absorbing and help significantly to reduce undesired reflected light.

In addition to the tiles 82, 84, 86, 88, 90 and 92, additional tiles in the form of diffraction bars 81, 83, 85, 87, 89, 91 and 93 may optionally be positioned in very close proximity to the pattern features to be transferred to wafer 14. Diffraction bars 81, 83, 85, 87, 89, 91 and 93 are closer to the pattern features than anywhere from 0.8 to three times the minimum spacing between the transferred pattern features. Diffraction bars 81, 83, 85, 87, 89, 91 and 93 function to provide sub-resolution assistance by changing the diffraction pattern of an isolated pattern feature to look like the diffraction pattern of a set of densely clustered pattern features. Therefore, while good pattern feature fidelity is provided by the use of tiles 82, 84, 86, 88, 90 and 92, even better pattern fidelity is provided when diffraction bars 81, 83, 85, 87, 89, 91 and 93 are also used.

The use of tiles 82, 84, 86, 88, 90 and 92 also improves the control of the mask critical dimensions (CDs) due to reductions in mask manufacturing proximity effects. In general, the mask manufacturing proximity effects have a similar proximity range as the flare proximity range and are therefore correctable by the same tiles 82, 84, 86, 88, 90 and 92. These improvements in mask CD control create an improvement in control of the wafer feature CDs and therefore improve circuit electrical performance.

Figure 6:
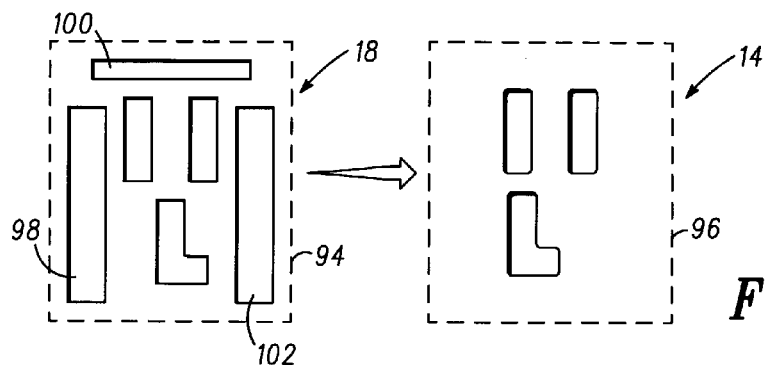
FIG. 6 illustrates a top view of a reflecting mask pattern transferred to a wafer with reduced flare error in accordance with another form of the present invention.

Illustrated in FIG. 6 is a top view of a reflecting mask pattern transferred to a wafer with reduced flare error. A flare proximity region 94 within mask 18 has the three previously illustrated features that are transferred to wafer 14 within a flare proximity region 96. Additionally, tiles 98, 100 and 102 are positioned around the features. Tiles 98, 100 and 102 have a significantly greater width and area than the tiles 82, 84, 86, 88, 90 and 92 of FIG. 5. Also, some of tiles 98, 100 and 102 have an area that is larger than some or all of the pattern features of flare proximity region 94. The tiles 98, 100 and 102 are not fully absorbing, but rather are partially attenuating or partially absorbing. Tiles 98, 100 and 102 absorb at least an additional 20% of the radiation incident on the tiles to that absorbed by the reflecting portion of pattern features of the mask. It should be noted that for additional fidelity, diffraction bars such as diffraction bars 81, 83, 85, 87, 89, 91 and 93 of FIG. 5 may also be used in the embodiment of FIG. 6. Tiles 98, 100 and 102 are to be positioned with respect to the transferred features and within flare proximity region 94 using the same rules for spacing as described above for tiles 82, 84, 86, 88, 90 and 92. Tiles 98, 100 and 102 also reduce undesired reflection with their partial radiation absorbing characteristic. By making the tiles 98, 100 and 102 only partially radiation absorbing, we have discovered that the tiles 98, 100 and 102 do not print onto or get transferred to the wafer 14. Therefore, the tiles 98, 100 and 102 may be made physically much larger than previous tiles that would transfer since such tiles were fully absorbing.

The use of tiles 98, 100 and 102 also improves the control of the mask CDs due to reductions in mask manufacturing proximity effects. In general, the mask manufacturing proximity effects have a similar proximity range as the flare proximity range and are therefore correctable by the same tiles 98, 100 and 102. These improvements in mask CD control create an improvement in control of the wafer feature CDs and therefore improve circuit electrical performance.

Figure 7:
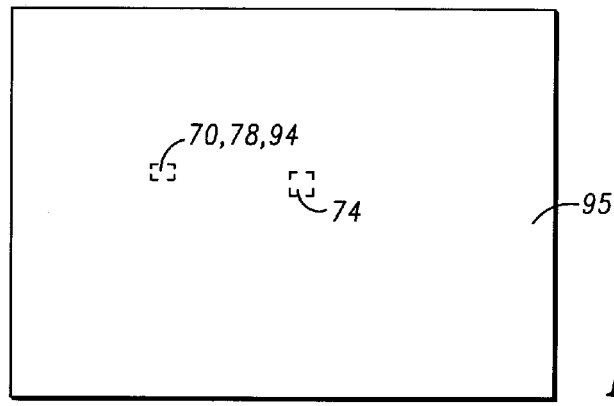
FIG. 7 illustrates a perspective view of an integrated circuit pattern on a mask incorporating the previously discussed pattern portions.

Illustrated in FIG. 7 is a perspective view of an integrated circuit pattern 95 on a mask incorporating the previously discussed flare proximity regions 70, 78, 94 and 74. Flare variation will differ for each of the flare proximity regions due to differences in the pattern density. Therefore, the pattern fidelity distortion associated with flare differs depending upon what portion of the integrated circuit pattern 95 is being processed.

Figure 8:
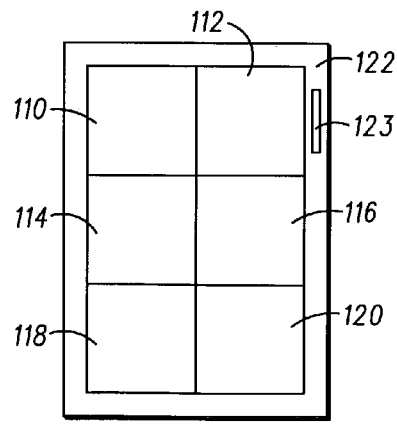
FIG. 8 illustrates a perspective view of a reflecting mask having a plurality of integrated circuits and having flare compensation inside and beyond the reflecting mask.

Illustrated in FIG. 8 is a perspective view of mask 18 from previous figures in which multiple integrated circuit patterns are grouped together into one mask 18. This permits the simultaneous production of multiple integrated circuits. In the illustrated form, integrated circuit patterns 110, 112, 114, 116, 118 and 120 are implemented in a joined array for a plurality of die. Each of integrated circuit patterns 110, 112, 114, 116, 118 and 120 may, in one form, represent the same pattern as integrated circuit pattern 95 of FIG. 7. Peripheral to the integrated circuit patterns 110, 112, 114, 116, 118 and 120 is a perimeter region in the form of a radiation absorbing border 122 for absorbing radiation. Since the radiation absorbing border 122 represents an abrupt change in pattern density from the integrated circuit patterns, it is desired to make the radiation absorbing border 122 become partially absorbing. In one form, radiation absorbing border 122 is implemented by chrome. By reducing the thickness of chrome used to implement radiation absorbing border 122, the amount of absorption of radiation absorbing border 122 can be reduced. This reduction in absorption at the border makes the amount of flare distortion across the integrated circuit pattern more uniform. With a completely absorbing border, the amount of flare at the periphery of the integrated circuit pattern is significantly lower than the amount of flare in the center of the integrated circuit pattern. Therefore, by making the border partially absorbing, the amount of flare at the periphery is increased to more closely match the flare in the central portion of the integrated circuit pattern. Another technique that might be used to make the radiation absorbing border 122 be partially absorbing is to insert one or more sub-resolution slots, such as a slot 123, in the radiation absorbing border 122 that will not be transferred to a wafer.

Figure 9:
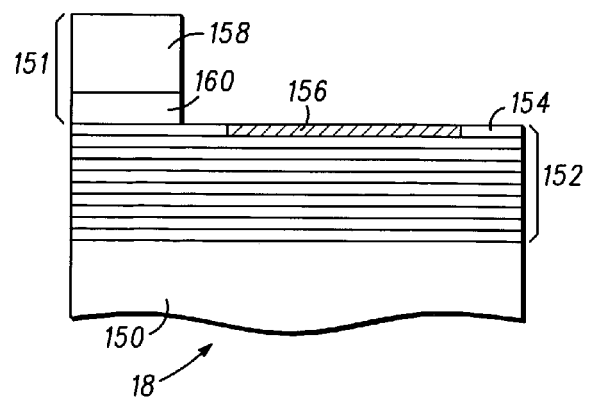
FIG. 9 illustrates in cross-section form a reflecting mask with flare compensation.

Illustrated in FIG. 9 is a cross-section of reflecting mask 18 with flare compensation. A substrate 150 has an overlying multilayer or multiple layer structure 152 that functions to reflect incoming radiation from a radiation source. Over a portion of the multiple layer structure 152 is an absorber layer in the form of an absorbing film stack 151 that represents but one of a plurality in a pattern of absorbing features on a substrate 150 of reflecting mask 18. The absorbing film stack 151 may have one or multiple layers. In the illustrated form, an absorbing layer or a first layer 160 and a second layer 158 are used. Typical materials include, for example, silicon dioxide, chrome, tantalum silicon nitride, tantalum nitride and molybdenum silicide. An upper or top portion of the multiple layer structure 152 includes a region 154. Within region 154 is an area 156 where region 154 is changed to be partially absorbing. There are various percentages in the amount of absorption that may be implemented. Generally, the amount of change in absorption of area 156 is at least twenty percent greater than the other portions of region 154 outside of area 156. In other words, there is provided a partially reflecting tile that absorbs at least an additional 20% of the radiation incident on the tile to that absorbed by the more reflecting portions of the mask. Typically this percentage will be greater, such as thirty percent or more, but may also be less than twenty percent. There are at least two embodiments to make reflecting mask 18 partially absorbing. Absorbing film stack 151 may be made partially absorbing by thinning, reducing or even removing the thickness of one or more of the multiple layers, such as thinning at least second layer 158. Another method to make reflecting mask 18 partially absorbing and create a desired reflectance is to convert, modify or 'damage' area 156 of region 154 such as by heating or annealing area 156. In one form, the modifying is accomplished by applying an electron beam to the selected area 156. Another method is to convert the selected area 156 by applying a laser beam to area 156. Yet another method is to convert area 156 by applying an ion beam to area 156.

By now it should be appreciated that there has been provided methods and a semiconductor optical system that minimizes the reduction in feature fidelity caused by flare. The anti-flare features described herein reduce flare diffraction effects on the order of greater than four times a wavelength of the illumination. The methods taught herein may be used to apply tiling for flare reduction to areas that are not able to accept a standard tile which resolves on the wafer. The partially transmissive/reflective tiles can be large enough in size to be easily patterned on a mask or reticle. Where size is more of a constraint, the tiles may be sized with a maximum width as taught above to reduce flare and also not resolve on the wafer. Because the features used herein for flare compensation are positioned far enough from features that will appear on a wafer, the compensating features do not appreciably change the radiation diffraction associated with the features to be transferred. When the mask is implemented as a reflecting mask having reflecting portions and absorbing portions, each of the tiles provided for anti-flare purposes forms an absorbing portion.

In the foregoing specification, the invention has been described with reference to specific embodiments. However, one of ordinary skill in the art appreciates that various modifications and changes can be made without departing from the scope of the present invention as set forth in the claims below. For example, the flare compensation method may be used for any value of radiation wavelength. The present invention is not limited to any particular type of semiconductor material or radiation source. Both transmitting and reflective masks and both positive and negative photoresist may be used herein. Various optical systems such as e-beam systems may be implemented. Improvements in critical dimension (CD) feature resolution is realized for short, medium and long range dimensions in a wafer. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

The invention claimed is:

1. A method of making a semiconductor device using radiation having a wavelength applied to photoresist on a wafer, comprising:
   providing a mask having a plurality of pattern features;
   providing an optical system;
   applying the photoresist to a surface of the wafer; and
   applying the radiation to the mask, from the mask to the optical system, and from the optical system to the photoresist;
   wherein the mask has a first pattern feature within a flare proximity region of the first pattern feature;
   wherein the flare proximity region has a tile having a length and a width for flare compensation;
   wherein the mask is characterized as having a minimum spacing for the plurality of pattern features, and the tile is disposed greater than four minimum spacings from the first pattern feature and is partially radiation absorbing by absorbing at least an additional twenty percent of radiation compared to that of the first pattern feature; and
   transferring the first pattern feature to the surface of the wafer without transferring the tile.

2. The method of claim 1, wherein the tile is longer than the first pattern feature by at least 100%.

3. The method of claim 1, wherein the mask is a reflecting mask having reflecting portions and absorbing portions, wherein the tile absorbs at least an additional thirty percent of radiation compared to that of the first pattern feature.

4. The method of claim 1, wherein the mask further comprises diffraction bars, wherein the diffraction bars are closer to the first pattern feature than three times a minimum spacing between pattern features, have a length substantially identical to the first pattern feature, and are non-resolving on the photoresist.

5. The method of claim 4, wherein the tile is longer than each of the diffraction bars.

6. The method of claim 1, wherein the tile comprises a plurality of multiple layers and is made partially absorbing by modifying a thickness of one of the multiple layers.

7. A method of making a semiconductor device using radiation applied to photoresist on a wafer, comprising:
   providing a mask having a plurality of pattern features;
   applying the photoresist to a surface of the wafer;
   providing an optical system;
   applying the radiation to the mask;
   reflecting the radiation from the mask to the optical system, and from the optical system to the photoresist;
   wherein the mask has a first pattern feature within a proximity region of the first pattern feature;
   wherein the mask has a tile in the proximity region that is partially absorbing and does not resolve on the photoresist;
   wherein the mask is characterized as having a minimum spacing for the plurality of pattern features;
   wherein the tile is closer to the first pattern feature than to any other pattern feature; and the tile is disposed greater than four minimum spacings from the first pattern feature.

8. The method of claim 7 further comprising forming the tile to be larger in area than the first pattern feature.

9. The method of claim 7, wherein providing the mask further comprises:
   providing a mask substrate having a pattern of absorbing features, wherein each of the absorbing features has an absorbing layer; and
   removing at least a portion of the absorbing layer of a selected one of the absorbing features to form the tile.

10. The method of claim 7, wherein providing the mask further comprises:
    providing a mask substrate with reflecting portions and absorbing portions; and
    modifying a selected one of the reflecting portions to become partially absorbing in order to form the tile.

11. The method of claim 10, wherein modifying the selected one of the reflecting portions further comprises applying an electron beam to the selected one of the reflecting portions.

12. The method of claim 10 wherein modifying the selected one of the reflecting portions further comprises applying a laser beam to the selected one of the reflecting portions.

13. The method of claim 12 wherein modifying the selected one of the reflecting portions further comprises applying an ion beam to the selected one of the reflecting portions.

14. The method of claim 7 further comprising providing diffraction bars on the mask, wherein the diffraction bars are closer to the first pattern feature than three minimum spacings, have a length substantially identical to the first pattern feature, and are non-resolving on the photoresist.

15. A method of making a semiconductor device using radiation having a wavelength applied to photoresist on a wafer, comprising:
    providing a mask having a plurality of pattern features;
    providing an optical system having a numerical aperture and a magnification;
    applying the photoresist to a surface of the wafer; and applying the radiation to the mask, from the mask to the optical system, and from the optical system to the photoresist;

wherein the mask has a first pattern feature of the plurality of pattern features in a flare proximity region of the first pattern feature;

wherein the flare proximity region has a tile that is only partially radiation absorbing and does not resolve on the photoresist in response to applying the radiation to the mask;

wherein the mask is characterized as having a minimum spacing for the plurality of pattern features;

wherein the tile is closer to the first pattern feature than to any other pattern feature and absorbs at least an additional twenty percent of incident radiation than the first pattern feature; and the tile is disposed greater than four minimum spacings from the first pattern feature.

16. The method of claim 15, wherein the tile comprises a multiple layer structure having an uppermost layer with a portion that is partially absorbing as a result of having been annealed.

17. The method of claim 16, wherein the tile absorbs at least an additional thirty percent of the radiation incident on the tile to that absorbed by the reflecting portion of the mask.

18. The method of claim 15, wherein providing the mask comprises:
providing a mask substrate having a pattern of absorbing features, wherein each absorbing feature has an absorbing layer; and
removing at least a portion of the absorbing layer of a selected one of the absorbing features to form the tile.

19. The method of claim 15, wherein providing the mask comprises:
providing a mask substrate with reflecting portions and absorbing portions;
converting a selected one of the reflecting portions to become partially absorbing in order to form the tile by applying energy to the selected one of the reflecting portions.

20. The method of claim 15, wherein the tile has a width that is less than 0.3 times the magnification, times the wavelength, and divided by the numerical aperture.

21. A lithography method comprising:
providing a mask with a design pattern having a flare susceptible region of principal design features having a minimum spacing and positioned with a pattern density that is susceptible to flare;
including anti-flare features in the flare susceptible region of the mask that are no closer to the principal design features than four minimum spacings, the anti-flare features comprising a material that is only partially absorbing and adapted to reduce flare that would adversely impact a critical dimension exposure of the principal design features on a corresponding region of a target wafer absent the anti-flare features; and
supplying illumination to the mask for transferring the design pattern onto the target wafer without transferring the anti-flare features.

22. The method of claim 21, wherein the mask is a reflective mask, the reflective mask comprising a substrate of multilayer reflectors with an absorber layer patterned thereon according to the design pattern, wherein the anti-flare features include at least one selected from the group consisting of (a) a selectively removed portion of the absorber layer and (b) a selectively modified portion of the multilayer reflectors.

23. The method of claim 22, wherein the selectively removed portion of the absorber layer further comprises removing a percentage of the absorber layer to thin the absorber layer and create a desired amount of partial reflection.

24. The method of claim 22, wherein the selectively modified portion of the multilayer reflectors further comprises modifying the multilayer reflectors by heating the multilayer reflectors to create a desired reflectance for the anti-flare features.

25. The method of claim 21 further comprises providing the mask as an optically transmissive mask, the optically transmissive mask including a substrate having a non-transmissive layer patterned thereon according to the design pattern, wherein the anti-flare features include selectively applied transmissive and non-transmissive anti-flare features.

26. A method of making a semiconductor device using radiation having a wavelength applied to photoresist on a semiconductor wafer, comprising:
providing a mask having a pattern for a plurality of die and having a radiation absorbing perimeter region around the pattern, wherein the perimeter region has one or more subresolution slots to make the perimeter region partially radiation absorbing, each pattern for the plurality of die further comprising a plurality of tiles for reducing flare and spaced from pattern features by at least four times a minimum predetermined spacing required between the pattern features;
applying the photoresist to a surface of the semiconductor wafer; and
applying the radiation to the mask and from the mask to the photoresist through an optical system;
wherein the plurality of tiles do not resolve in the photoresist in response to applying the radiation to the mask as a result of the plurality of tiles comprising partially radiation absorbing material.

* * * * *